(12) United States Patent
Chiu et al.

(10) Patent No.: US 9,277,195 B2
(45) Date of Patent: Mar. 1, 2016

(54) PIXEL ARRAY WITH CLEAR AND COLOR PIXELS EXHIBITING IMPROVED BLOOMING PERFORMANCE

(71) Applicant: Taiwan Semiconductor Manufacturing Co., Ltd., Hsin-Chu (TW)

(72) Inventors: Kai-Ling Chiu, Zhudong Township (TW); Masayuki Uchiyama, Hsinchu (TW); Po-Chun Chiu, Taipei (TW); Tse-Hua Lu, Zhubei (TW); Yuichiro Yamashita, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 29 days.

(21) Appl. No.: 14/247,457

(22) Filed: Apr. 8, 2014

(65) Prior Publication Data

US 2015/0288940 A1     Oct. 8, 2015

(51) Int. Cl.
*H04N 9/73* (2006.01)
*H04N 9/04* (2006.01)

(52) U.S. Cl.
CPC .............. *H04N 9/735* (2013.01); *H04N 9/045* (2013.01)

(58) Field of Classification Search
CPC ............................... H04N 9/735; H04N 9/045
USPC ........................................................ 348/272
See application file for complete search history.

(56) References Cited

U.S. PATENT DOCUMENTS

| | | | |
|---|---|---|---|
| 6,633,028 B2 | 10/2003 | Fowler | |
| 8,093,541 B2 | 1/2012 | Chen | |
| 8,405,751 B2 | 3/2013 | Hibbeler et al. | |
| 2006/0092300 A1 | 5/2006 | Tan et al. | |
| 2007/0076269 A1* | 4/2007 | Kido et al. | 358/474 |
| 2008/0128598 A1* | 6/2008 | Kanai et al. | 250/226 |
| 2013/0193311 A1* | 8/2013 | Yoshida | 250/208.1 |
| 2013/0308021 A1* | 11/2013 | Bai et al. | 348/272 |
| 2014/0084409 A1* | 3/2014 | Nagaraja | 257/445 |

OTHER PUBLICATIONS

Axis Communications. "CCD and CMOS Sensor Technology." Technical White Paper. Published in 2010.

* cited by examiner

*Primary Examiner* — Gevell Selby
(74) *Attorney, Agent, or Firm* — Eschweiler & Associates, LLC

(57) ABSTRACT

This disclosure provides pixel arrays made up of a clear pixel and a color pixel. The color pixel includes a first photo-detecting element and a color pixel access transistor to selectively couple the first photo-detecting element to a first charge-storage node. The clear pixel includes a second photo-detecting element and a clear pixel access transistor to selectively couple the second photo-detecting element to a second charge-storage node. The color pixel access transistor transfers a first charge per unit time between the first photo-detecting element and the first charge-storage node. The clear pixel access transistor transfers a second charge per unit time between the clear pixel access transistor and the second charge-storage node. The first charge per unit time is less than the second charge per unit time to mitigate blooming. In other embodiments, the clear pixel includes an excess-charge transfer path that couples the clear pixel to a DC supply node to mitigate blooming.

20 Claims, 4 Drawing Sheets

PIXEL ARRAY WITH CLEAR AND COLOR PIXELS EXHIBITING IMPROVED BLOOMING PERFORMANCE

BACKGROUND

Digital cameras and optical imaging devices employ image sensors. Image sensors convert optical images to digital data that may be represented as a digital image. Image sensors include an array of pixels, which are unit devices for the conversion of the optical image into digital data. The pixels often manifest themselves as charge-coupled devices (CCDs) or complementary metal oxide semiconductor (CMOS) sensors. While CMOS image sensors (CIS) devices have been more recently developed compared to CCDs, CIS devices provide an advantage of lower power consumption, smaller size, and faster data processing than CCDs as well as direct digital output that is not available in CCDs. Also, CIS devices have lower manufacturing cost compared with CCDs since many standard semiconductor manufacturing processes may be employed to manufacture CIS devices. For these reasons, commercial employment of CIS devices has been steadily increasing in recent years.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
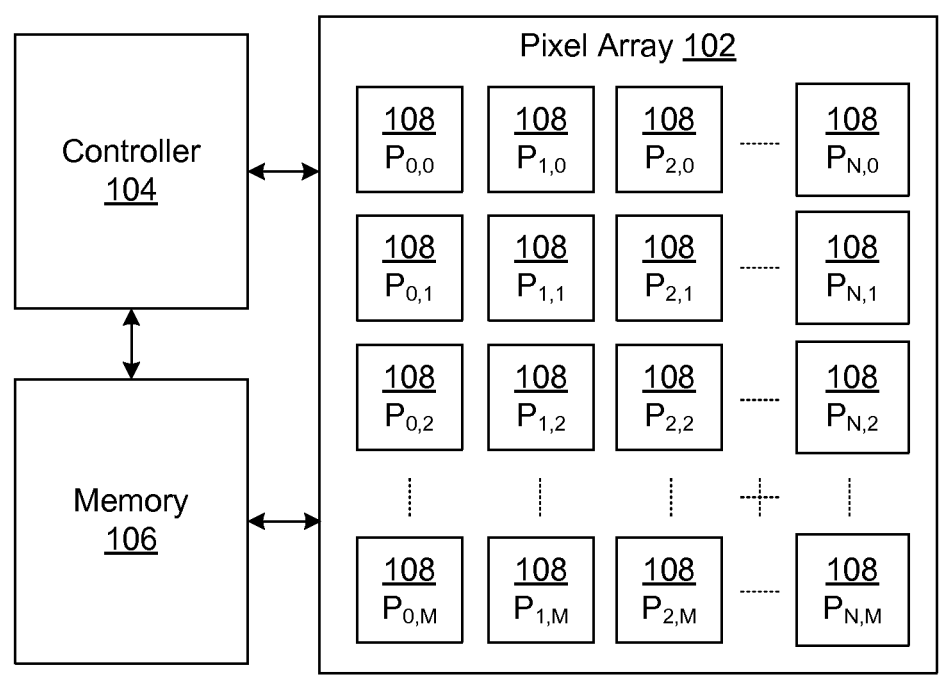
FIG. 1 illustrates a CIS device that includes an array of pixels in accordance with some embodiments.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices such as cameras, cellular telephones, personal digital assistants (PDAs), MP3 players, computers and other devices include an image sensor device for capturing images. One example of an image sensor device is a complementary metal-oxide semiconductor (CMOS) image sensor (CIS) device. As shown in FIG. 1, an image sensor device 100 includes a focal plane pixel array 102, a controller 104, and memory 106. The focal plane pixel array 102 typically includes individual pixels 108, which are arranged in a series of N rows and M columns, wherein M and N are positive integers. In FIG. 1's example, the individual pixels 108, which include respective photodiodes therein, have been labeled $P_{row}$, $P_{column}$ for clarity, and it will be appreciated that M and N can be equal or non-equal, depending on the implementation. Because the photodiodes within the pixel array 102 are naturally 'color blind', a color filter array (not shown) is typically arranged in front of the pixel array 102 to allow the pixel array 102 to assign color tones to each pixel. A common color registration method is called the 'Bayer RGB (Red, Green, and Blue)' pattern, which has been the standard color filter arrangement in single-sensor color imaging for almost 40 years. Red, green, and blue are the primary colors that, mixed in different combinations, can produce most of the colors visible to the human eye. Due to the increasing complexity of silicon technology and the need to improve low-light SNR (signal to noise ratio), there has been renewed interest in panchromatic clear (C) pixels, because they offer roughly twice the signal intensity of traditional red, green, and blue (RGB) pixels. Thus, a CRGB (Clear, Red, Green, Blue) filter arrangement is currently used by many CIS companies to improve low light imaging quality.

During image capture operations in these CRBG image sensors, a camera shutter is opened to expose pixels array 102 to light (e.g., an image), and the individual pixels 108 each record light impingent at their respective array locations for some integration time. The image data is then transferred and stored in memory 106, and controller 104 subsequently gathers all the image data, and determines the light intensity recorded at each pixel to reconstruct a digital version of the image. In this way, color images can be digitally recorded so device users can share the images on a computer, share them with friends, and the like.

Unfortunately, CRGB image sensors based on arrays of photodiodes suffer from a phenomenon known as "blooming". Blooming occurs when the amount of charge generated at a pixel exceeds the storage capacity (FWC-full well capacity) of the pixel and excess charge overflows into neighboring pixels. This may occur if the integration period is too long or the light incident on the pixel is too bright. This excess or overflow charge is indistinguishable from the charge that would be generated in the neighboring photodiodes if those photodiodes had been subjected to light. Hence, the neighboring photodiodes appear to be irradiated with more light than actually impingent thereon due to the excess or overflow charge. Accordingly, a small, high-intensity, light irradiation pattern at one or more pixels appears to "bloom" into a much larger pattern over neighboring pixels as well. For example, in FIG. 1, if pixel $P_{1,1}$ was struck with a high-intensity light that over-saturated the storage capacity of pixel $P_{1,1}$; excess charge could leak out through the substrate to neighboring pixels (e.g., $P_{1,0}$, $P_{0,1}$, $P_{0,1}$, $P_{2,1}$, or $P_{1,2}$), causing these pixels to report misleadingly high light levels. To limit this blooming somewhat, conventional devices discharge pent up carriers though an access transistor based on whether a TX signal is asserted. In conventional devices, all access transistors are the same, such that the clear pixels and color pixels have identical access transistors.

Because each color pixel tends to receive a relatively narrow spectrum of light (e.g., filtered red, blue, or green light), compared to clear pixels that receive a relatively wide spectrum of light, clear pixels tend to produce more charge for most impingent radiation. For this reason, clear pixels are more likely to cause "blooming" effects in conventional CRBG image sensors. Accordingly, rather than providing identical access transistors for clear pixels and color pixels as in conventional devices, the present disclosure provides clear pixel access transistors that transfer more current per unit time than color pixel access transistors, thereby allowing the excess charge on the clear pixels to be dissipated more quickly to mitigate clear pixel blooming. In other embodiments, an excess-charge transfer path is provided for clear pixels to allow the clear pixels to effectively dissipate excess charge. In embodiments where the clear pixels include such an excess-charge transfer path, the color pixels often exhibit a lack of an analogous excess-charge transfer path, which can conserve area for the color pixels and keep the pixel array more dense. Thus, with these techniques, problematic blooming issues for clear pixels can be reduced.

Figure 2A:
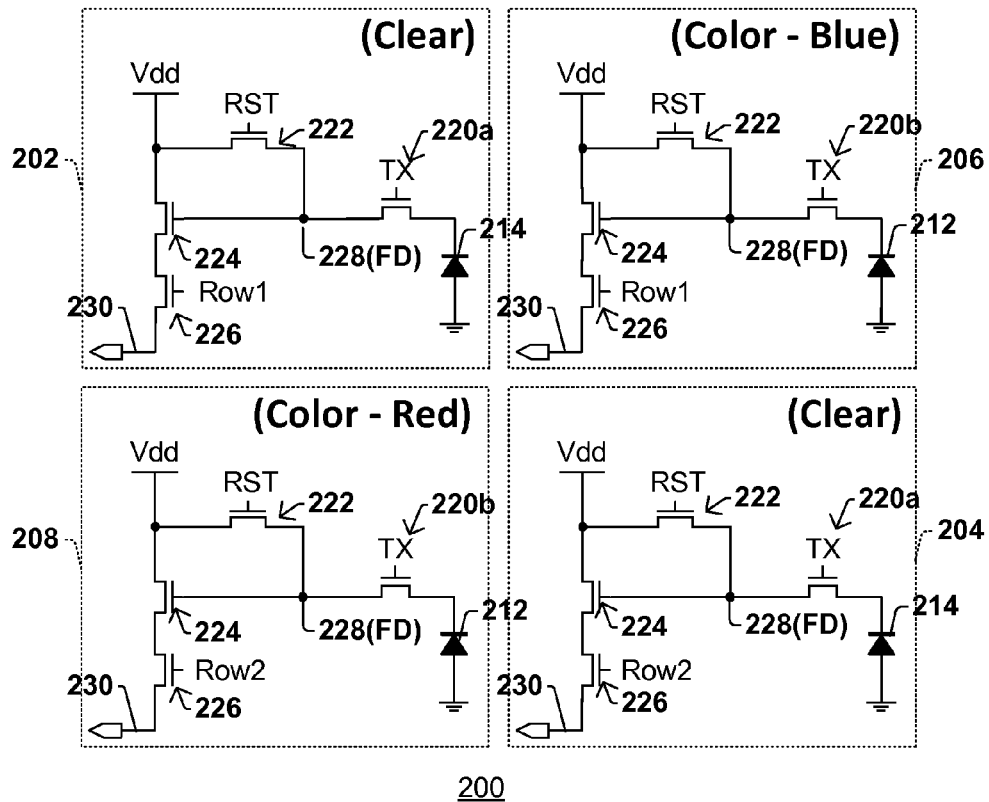
FIG. 2A illustrates a schematic view of a portion of an array of pixels which includes clear pixels and color pixels, for example, red, blue, and green pixels.

FIG. 2A illustrates a schematic of a pixel group 200, which is a portion of a larger pixel array, comprising clear pixels 202, 204 and colors pixels 206, 208 in accordance with some embodiments. As can be seen from FIG. 2B, the color pixels (e.g., 208) include monochromatic color filters 210 there over so light of only a particular color strikes a photo-detecting element 212 for any given color pixel, while no such monochromatic filters are present over the clear pixels such that a wide spectrum of light strikes the clear pixels. For example, in the illustrated example, a red color pixel 208 has a red monochromatic filter 210 arranged there over, and a blue color filter 206 has a blue color filter arranged there over, while the clear pixels lack a monochromatic filter there over. Although a blue pixel and a red pixel are shown for illustration, although other color pixels, such as green pixels for example, can also be present.

Each pixel includes a photo-detecting element, such as a photodiode made up of a p-type lower region 216 and an n-type upper region 218, to detect incident light. Each pixel also includes an access transistor 220, a reset transistor 222, a source-follower transistor 224, and a row select transistor 226. A charge storage node 228, which is in some embodiments referred to as a "floating diffusion" (FD) region, is arranged between the access transistor 220 and reset transistor 222, being at a gate of the source-follower transistor 224.

Figure 2B:
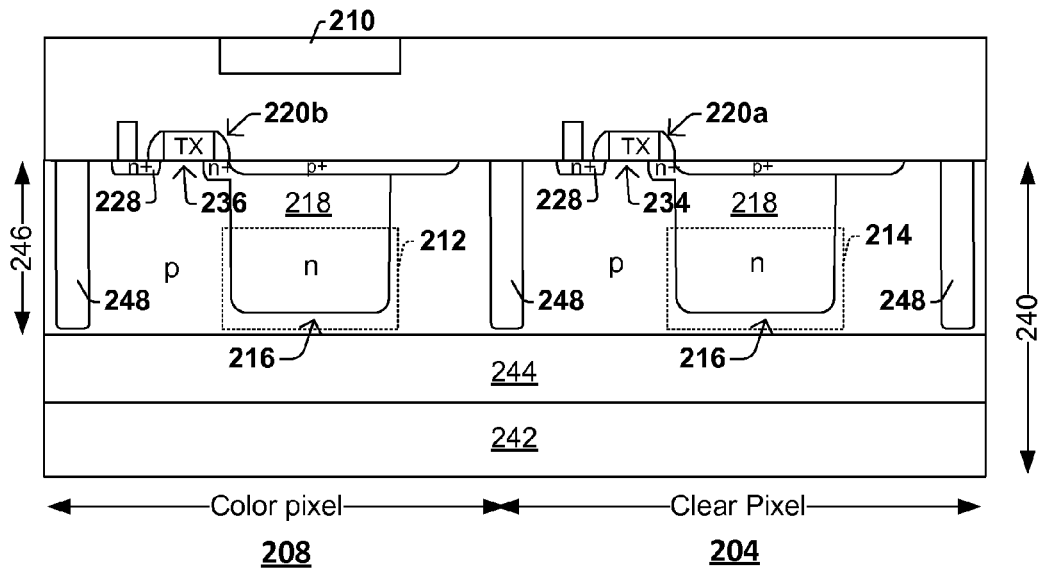
FIG. 2B illustrates a cross-sectional view of a portion of a semiconductor substrate with a clear pixel region and color pixel region in accordance with some embodiments consistent with FIG. 2A.

As can be seen in FIG. 2B, the pixel array 200 can be formed on a substrate 240. In some embodiments, the substrate includes a handle wafer 242, such as a Si wafer or a III-V substrate, an oxide layer 244, and an active silicon area 246 over the oxide layer 244. Isolation structures 248 extend into the active area 246 and circumscribe the individual pixels to provide isolation between neighboring pixels. The isolation structures 248 can manifest themselves as dielectric regions buried in the semiconductor substrate 240, or doped regions implanted into the semiconductor substrate 240 to limit charge flow.

During operation of pixel array 200, a shutter opens to expose the individual pixels to light (e.g., an optical image). The impingent light causes electron-hole recombination to occur in the junction of the photodiodes 212, 214, generating charge carriers whose levels build up according to the intensity of light received at a given pixel. At a predetermined time, the RST signal is pulsed high to couple the charge storage node 228 to a DC supply voltage (VDD) and thereby prepare for the charge storage node 228 to measure the charge delivered by the photodiodes 212, 214 (corresponding to light measured by photodiodes). The row signal of a row to be accessed, for example row 1, is also pulsed high. The TX signal is then pulsed high for some integration time, causing the photo-diodes 212, 214 along that row to discharge charge, in proportion to their detected light levels, through the access transistors 220 to the charge storage nodes 228. This charge may be referred to as an integrated photo-measurement signal. As the charge storage node 228 accumulates electrons, its voltage is pulled down, thereby tending to turn off the source/follower transistor 224, and reducing current flow out of the pixel output 230. After the TX signal is asserted, the change in current due to assertion of TX, which is often integrated, is measured to determine the intensity of light detected by the pixel.

Whatever the precise circuitry used to detect the intensity of light detected by the pixel, if too much charge accumulates in the active substrate region of a pixel, blooming can occur. To limit blooming for the clear pixels 202, 204, which tend to generate more charge carriers because of their broad spectrum detection, in some embodiments the clear pixel access transistors 220a are set to have a first threshold voltage, while the color pixel access transistors 220b are set to have a second threshold voltage. The first voltage threshold is less than the second voltage threshold. In this way, when equal gate voltages are applied to the clear pixel access transistors 220a and the color pixel access transistors 220b, the clear pixel access transistors 220a tend to transfer more charge per unit time to their respective charge-storage nodes, to help limit any excess charge buildup that can lead to blooming. The first and second voltage thresholds can be set to different values by implanting different dopant concentrations into the channel regions 234 of the clear pixel access transistors 220, relative to the dopant concentrations of the channel regions 236 of the color pixel access transistors 220b.

In other embodiments the clear pixel access transistors 220 as are set to have a first width-to-length ratio ($W_1/L_1$), while the color pixel access transistors 220b are set to have a second width-to-length ratio ($W_2/L_2$). The first width-to-length ratio is greater than the second width-to-length ratio. In this way, when equal gate voltages are applied to the clear pixel access transistors 220a and the color pixel access transistors 220b, the clear pixel access transistors 220a tend to transfer more charge per unit time to their respective charge-storage nodes 228, to help limit any excess charge buildup that can lead to blooming. As is appreciated by a person of ordinary skill in the art, a width-to-length ratio refers to the length of a polysilicon gate separating source/drain regions of the access transistors and a width of a polysilicon gate as measured perpendicularly to the length. In some embodiments, the clear pixel access transistors 220a exhibit a width-to-length ratio that is approximately twice that of the color pixel access transistors 220b, such that the clear pixel access transistors 220a transfer approximately twice the amount of charge per unit time as the color pixel access transistors 220b, thereby offsetting an expected excess charge buildup for the clear pixel access transistors.

Figure 3A:
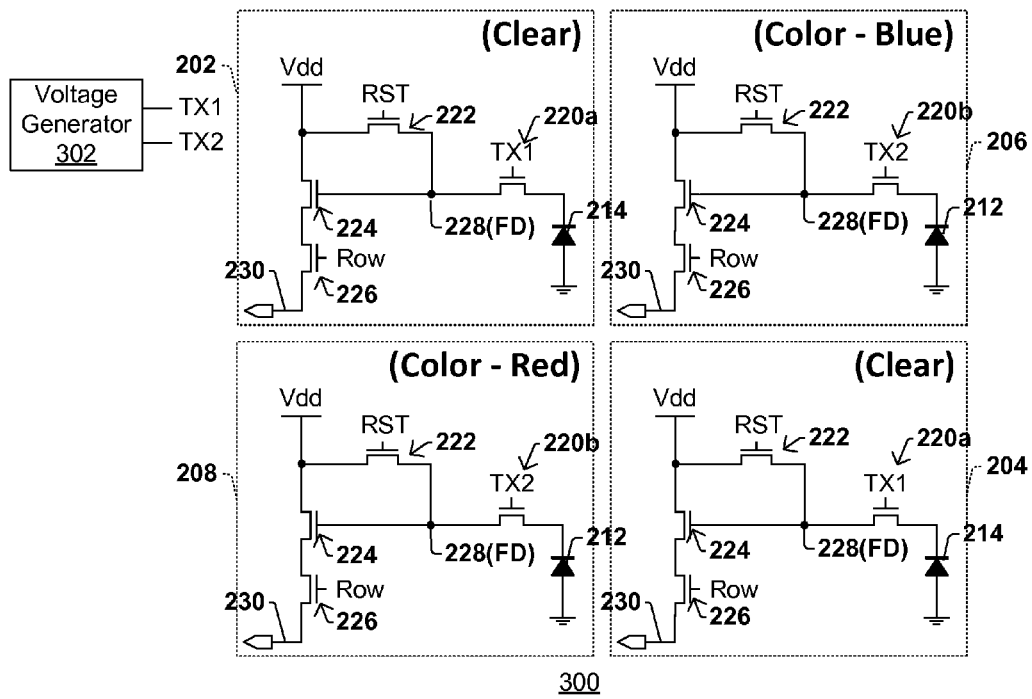
FIG. 3A illustrates a schematic view of a portion of an array of pixels which includes clear pixels and color pixels in accordance with some embodiments, wherein access transistors of the clear pixels are biased with different gate voltages compared to access transistors of the color pixels during operation.
Figure 3B:
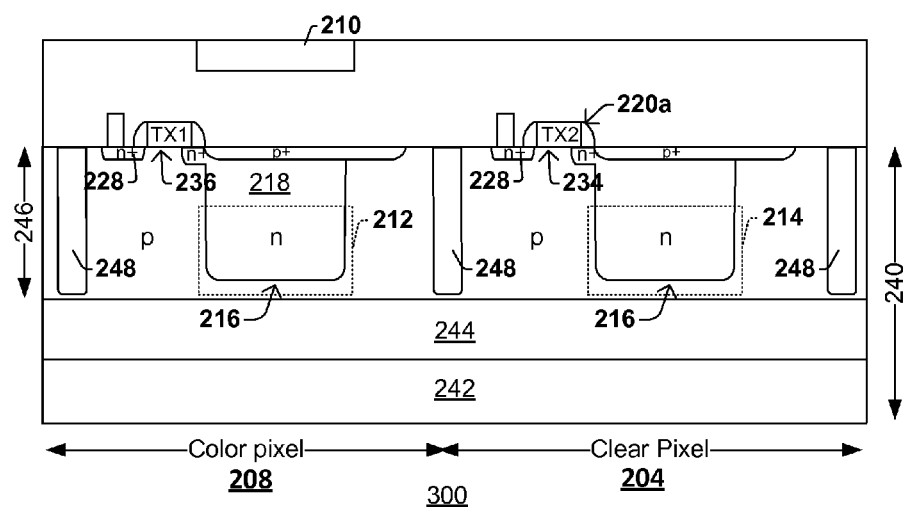
FIG. 3B illustrates a cross-sectional view of a portion of a semiconductor substrate with a clear pixel region and color pixel region in accordance with some embodiments consistent with FIG. 3A.

FIGS. 3A-3B illustrate another example of a pixel group 300, which is a portion of a larger pixel array, comprising clear pixels and colors pixels in accordance with some embodiments. This pixel group 300 again includes photodiodes 212, 214, access transistors 220, reset transistors 222, source follower transistors 224, and row select transistors 226, which operate similar to previously described in FIG. 2A. However, in the embodiment of FIGS. 3A-3B, the clear pixel access transistors 220a can be the same as the color pixel access transistors 220b. In other words, the clear pixel access transistors 220a and color pixel access transistors 220b can have the same W/L ratios and the same threshold voltages as one another. In this example, in order to enable the clear pixel access transistors 220a to provide a greater charge transfer per unit time than the color pixel access transistors 220b, different gate voltages are applied to the gates of the clear pixel access transistors 220a and color pixel access transistors 220b. For example, a gate voltage TX1 of −0.5 V can be applied to the clear pixel access transistors 220a while a gate voltage TX2 of −1.0 V can be applied to the color pixel access transistors 220b. To implement this different gate voltage, FIG. 3A's circuit includes voltage generator 302 to provide these voltages. In some embodiments, the voltage generator 302 may include a voltage divider, such as a series of resistors arranged in series with nodes between the resistors providing different voltages. In other embodiments, the voltage generator 302 can take any number of other forms, such as a bandgap reference circuit, voltage regulator, or charge pump, among others.

Figure 4A:
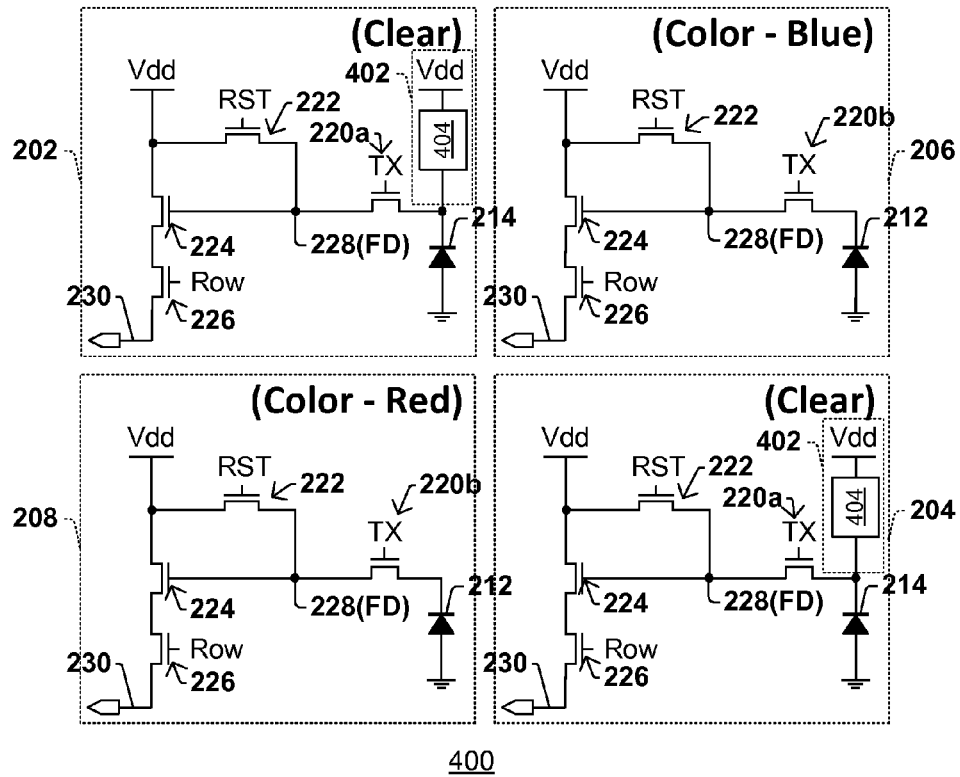
FIG. 4A illustrates a schematic view of a portion of an array of pixels which includes clear pixels and color pixels, wherein the clear pixels having an excess-charge transfer path in accordance with some embodiments.
Figure 4B:
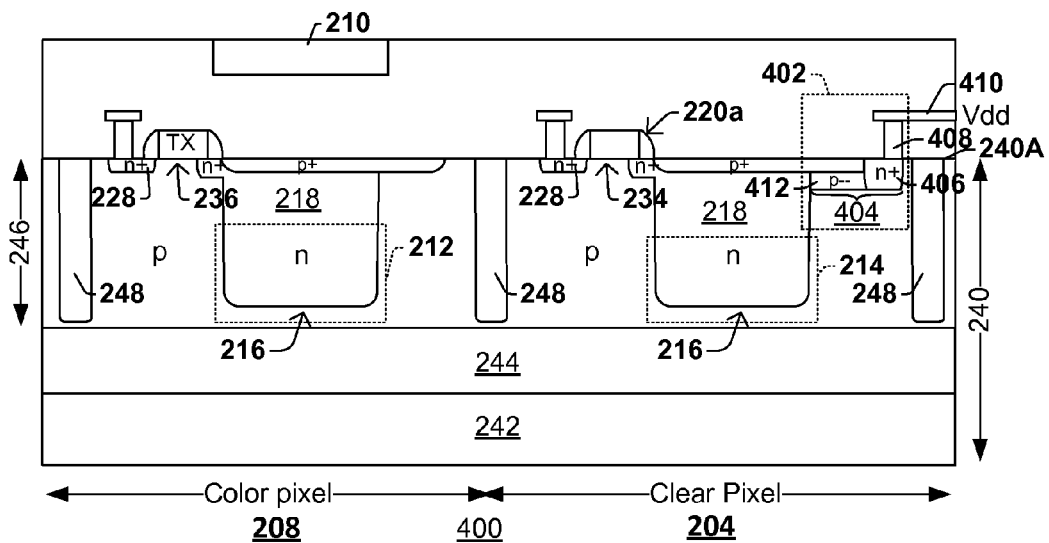
FIG. 4B illustrates a cross-sectional view of a portion of a semiconductor substrate with a clear pixel region and color pixel region in accordance with some embodiments consistent with FIG. 4A.

FIGS. 4A-4B illustrate another example of a pixel group 400, which is a portion of a larger pixel array, comprising clear pixels and colors pixels in accordance with some embodiments. This pixel group 400 again includes photodiodes 212, 214, access transistors 220, reset transistors 222, source follower transistors 224, and row select transistors 226, which operate similar to previously described in FIG. 2A. Thus, each pixel includes a charge measurement path running between the photodiode, access transistor, source-follower transistor 224, and row select transistor 226. However, in the embodiment of FIGS. 4A-4B, the clear pixels 202, 204 also each include an excess-charge transfer path 402, which includes a circuit element 404 to couple photodiode 212 to DC supply node (VDD). This excess-charge transfer path 402 is separate from the charge-storage node 228 (FD), which is the usual path for charge to flow from the photodiode 214 during measurement. Thus, the excess-charge transfer path 402 does not pass through the charge storage node 228. To save area in the pixel array 400 and to ensure the color pixels still retain significant charge, the color pixels 206, 208 lack an analogous excess-charge transfer path corresponding to the excess-charge transfer path 402 for the clear pixels 202, 204.

During operation, the circuit element 404 on the excess-charge transfer path to limit or prevent charge from flowing over the excess-charge transfer path 402 when the charge buildup for a clear pixel is less than some predetermined voltage threshold where blooming is expected to occur for that clear pixel. For example, if the present level of charge on a clear pixel becomes greater than a blooming-susceptible charge level, than the circuit element 404 can promote charge transfer from the photodiode 212 to the DC supply voltage VDD over the excess-charge transfer path 402 to limit or prevent blooming. However, so long as the present level of charge on a clear pixel is less than this blooming-susceptible charge level, then the circuit element 404 can leave the photodiode 214 substantially isolated from the DC supply voltage VDD.

In some embodiments, the circuit element 404 includes at least one passive device 404 and a lack of active devices. This passive device can manifest itself as a diode or a resistor, for example, and is configured to substantially limit or prevent charge flowing over the excess-charge transfer path 402 when the charge buildup for a clear pixel is less than some predetermined voltage threshold where blooming can occur. FIG. 4B shows an embodiment where the excess-charge transfer path 402 includes a doped contact region 406 arranged near an upper substrate surface 240A for clear pixel 204. This doped contact region 406 has the same conductivity as upper photodiode region 218, and can be a heavily doped N+ region, for example. A contact or via 408 extends vertically between the doped contact region 406 and a conductive line 410 corresponding to the DC supply node (VDD). To promote excess-charge transfer, a lightly doped region 412, having a doping type that is opposite to that of the doped contact region 406 extends continuously between the upper photodiode region 218 and the doped contact region 406. Thus, when excess-charge accumulates, the excess-charge flows from the photodiode 214, over the lightly doped region 412, through the doped contact region 406, and up the contact/via 408, to the DC supply node (VDD). Thus, the excess charge is transferred from the active region 246 of clear pixel 204 to the DC supply node (VDD) without passing under isolation structure 248. The doped contact region 406 can also be shared with the reset transistor 222 and the drain of source/follower 224, at the portions of those nodes coupled to VDD. Further, sharing the doped contact region 406 for the RST transistor and drain of the source/follower 224 for this anti-blooming path can be beneficial as this can limit the need to assign additional space for the doped contact region 406.

Thus, as can be appreciated from above, the present disclosure provides CRBG pixel array devices and methods to help dissipate excess charge from clear pixels in a quick and efficient manner to mitigate blooming. In particular, in some embodiments, access transistors for clear pixels are set to transfer more current per unit time than access transistors for color pixels, thereby allowing the excess charge on the clear pixels to be dissipated quickly. In other embodiments, an excess-charge transfer path is provided for clear pixels to allow the clear pixels to effectively dissipate excess charge. In embodiments where the clear pixels include such an excess-charge transfer path, the color pixels often exhibit a lack of an analogous excess-charge transfer path, which can conserve area for the color pixels and keep the pixel array more dense. Thus, with these techniques, problematic blooming issues for clear pixels can be reduced.

Therefore, some embodiments relate to an integrated circuit (IC). The IC includes a color pixel including a first photo-detecting element and a color pixel access transistor to selectively couple the first photo-detecting element to a first charge-storage node. The IC also includes a clear pixel including a second photo-detecting element and a clear pixel access transistor to selectively couple the second photo-detecting element to a second charge-storage node. The color pixel access transistor is configured to transfer a first charge per unit time between the first photo-detecting element and the first charge-storage node. The clear pixel access transistor is configured to transfer a second charge per unit time between the clear pixel access transistor and the second charge-storage node. The first charge per unit time is less than the second charge per unit time.

Other embodiments relate to a pixel array arranged on an integrated circuit. The pixel array includes a color pixel and a clear pixel. The color pixel includes a first photo-detecting element and a color pixel access transistor formed in a first active region of a semiconductor substrate. The color pixel access transistor is configured to selectively couple the first photo-detecting element to a DC supply node through a first charge-storage node associated with the color pixel. The clear pixel includes a second photo-detecting element and a clear pixel access transistor formed in a second active region of the semiconductor substrate. The clear pixel access transistor is configured to selectively couple the second photo-detecting element to the DC supply node through a second charge-storage node associated with the clear pixel. An excess-charge transfer path to transfer excess charge from the second active region to the DC supply node without passing through the second charge-storage node.

Still other embodiments relate to an integrated circuit (IC) including a pixel array, which includes a color pixel and clear pixel. The color pixel corresponds to a first active region of a semiconductor substrate and has a first charge transfer path to provide an integrated photo-measurement signal from the color pixel. The clear pixel corresponds to a second active region of the semiconductor substrate and has a second charge transfer path to provide a second integrated photo-measurement signal from the clear pixel. An excess-charge transfer path is distinct from the second charge transfer path and is used to transfer excess charge from the second active region. A controller is configured to determine light intensity measured by the color pixel based on the current- or voltage-level of the first integrated photo-measurement signal. The controller is further configured to determine light intensity measured by the clear pixel based on the current- or voltage-level of the second integrated photo-measurement signal without accounting for the transferred excess charge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a color pixel including: a first photo-detecting element, and a color pixel access transistor to selectively couple the first photo-detecting element to a first charge-storage node; and
a clear pixel including: a second photo-detecting element, and a clear pixel access transistor to selectively couple the second photo-detecting element to a second charge-storage node;
wherein the color pixel access transistor is configured to transfer a first charge per unit time between the first photo-detecting element and the first charge-storage node, and wherein the clear pixel access transistor is configured to transfer a second charge per unit time between the clear pixel access transistor and the second charge-storage node, wherein the second charge per unit time is greater than the first charge per unit time; and
wherein the color pixel access transistor and clear pixel access transistor have different width-to-length ratios or different voltage thresholds from one another.

2. The IC of claim 1:
wherein the color pixel access transistor has a first width-to-length ratio;
wherein the clear pixel access transistor has a second width-to-length ratio; and
wherein the first width-to-length ratio is less than the second width-to-length ratio.

3. The IC of claim 1:
wherein the color pixel access transistor has a first voltage threshold;
wherein the clear pixel access transistor has a second voltage threshold; and
wherein the first voltage threshold is smaller in magnitude than the second voltage threshold by a predetermined amount.

4. The IC of claim 3, wherein the color and clear pixel access transistors have different dopant concentrations in active regions thereof to establish the second voltage threshold being smaller in magnitude than the second voltage threshold.

5. The IC of claim 1, further comprising:
a voltage generator configured to provide a first non-zero voltage level to a gate of the color pixel access transistor to couple the first photo-detecting element to the first charge-storage node, and further configured to provide a second non-zero voltage level to a gate of the clear pixel access transistor to couple the second photo-detecting element to the second charge-storage node, wherein the first and second non-zero voltage levels are different.

6. The IC of claim 1, wherein the clear pixel further comprises an excess-charge transfer path to transfer excess charge from the clear pixel to a DC supply node without the transferred charge being passed through the first charge storage node.

7. The IC of claim 6, wherein the color pixel lacks an analogous excess-charge transfer path corresponding to the excess-charge transfer path of the clear pixel.

8. The IC of claim 6, wherein the excess-charge transfer path exhibits at least one passive device and a lack of active devices.

9. The IC of claim 6, wherein the excess-charge transfer path comprises:
a doped contact region arranged near an upper surface of an active region of the clear pixel; and
a contact or via extending vertically between the doped contact region and a conductive line corresponding to the DC supply node.

10. A pixel array arranged on an integrated circuit (IC), comprising:
a color pixel including: a first photo-detecting element, and a color pixel access transistor formed in a first active region of a semiconductor substrate, wherein the color pixel access transistor is configured to selectively couple the first photo-detecting element to both a DC supply node and a color pixel output through a first charge-storage node;

a clear pixel including: a second photo-detecting element, and a clear pixel access transistor formed in a second active region of the semiconductor substrate, wherein the clear pixel access transistor is configured to selectively couple the second photo-detecting element to both a DC supply node and a clear pixel output through a second charge-storage node; and an excess-charge transfer path to transfer excess charge from the second active region to the DC supply node without passing through the second charge-storage node;

wherein the color pixel lacks an analogous excess-charge transfer path corresponding to the excess-charge transfer path of the clear pixel.

11. The IC of claim 10, further comprising:
an isolation structure arranged in the semiconductor substrate and circumscribing the second active region, wherein the excess charge is transferred from the second active region to the DC supply node without passing under the isolation structure.

12. The IC of claim 10, wherein the excess-charge transfer path exhibits at least one passive device and a lack of active devices.

13. The IC of claim 10, wherein the excess-charge transfer path comprises:
a doped contact region arranged near an upper surface of an active region of the clear pixel; and
a contact or via extending vertically between the doped contact region and a conductive line corresponding to the DC supply node.

14. The IC of claim 13, wherein the excess-charge transfer path further comprises:
a lightly doped region extending continuously between the doped contact region and an edge of the second photo-detecting element in the substrate.

15. The IC of claim 10, wherein the first and second active regions are silicon and wherein the first and second photo-detecting elements are photo-diodes.

16. The IC of claim 10, wherein the color pixel access transistor and clear pixel access transistor have different width-to-length ratios or different voltage thresholds from one another.

17. An integrated circuit (IC) including a pixel array, comprising:
a color pixel corresponding to a first active region of a semiconductor substrate and having a first charge measurement path to provide a first integrated photo-measurement signal from the color pixel;
a clear pixel corresponding to a second active region of the semiconductor substrate and having a second charge measurement path to provide a second integrated photo-measurement signal from the clear pixel;
an excess-charge transfer path that is distinct from the second charge measurement path to transfer excess charge from the second active region; and
a controller configured to determine light intensity measured by the color pixel based on a current- or voltage-level of the first integrated photo-measurement signal, and further configured to determine light intensity measured by the clear pixel based on a current- or voltage-level of the second integrated photo-measurement signal without accounting for the transferred excess charge;
wherein the color pixel lacks an analogous excess-charge transfer path corresponding to the excess-charge transfer path of the clear pixel.

18. The IC of claim 17, wherein the excess-charge transfer path comprises:
a doped contact region arranged near an upper surface of an active region of the clear pixel; and
a contact or via extending vertically between the doped contact region and a conductive line corresponding to a DC supply node.

19. The IC of claim 18, wherein the excess-charge transfer path further comprises:
a lightly doped region extending continuously between the doped contact region and an edge of a photo-detecting element of the clear pixel in the substrate.

20. The IC of claim 17, wherein the color pixel includes a color pixel access transistor and the clear pixel includes a clear pixel access transistor, the color pixel access transistor and clear pixel access transistor having different width-to-length ratios or different voltage thresholds from one another.

* * * * *